United States Patent
Teo et al.

(10) Patent No.: US 7,220,953 B2
(45) Date of Patent: May 22, 2007

(54) PHOTODIODE CIRCUIT WITH IMPROVED RESPONSE TIME

(75) Inventors: Chee Keong Teo, Singapore (SG); John Julius Asuncion, Singapore (SG); Kok Soon Yeo, Singapore (SG); Lian Chun Xu, Singapore (SG); Wai Keat Tal, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/084,584

(22) Filed: Mar. 18, 2005

(65) Prior Publication Data

US 2006/0208164 A1 Sep. 21, 2006

(51) Int. Cl.
*G01J 1/44* (2006.01)
*H01L 31/00* (2006.01)
*H03K 5/08* (2006.01)

(52) U.S. Cl. .............................. 250/214 R; 250/214.1; 327/321

(58) Field of Classification Search ............ 250/214 R, 250/214.1; 327/514, 309, 321
See application file for complete search history.

(56) References Cited

U.S. PATENT DOCUMENTS

| | | | |
|---|---|---|---|
| 3,601,625 A | 8/1971 | Redwine et al. | |
| 4,005,342 A | 1/1977 | Davis | |
| 4,131,928 A | 12/1978 | Davis et al. | |
| 5,809,102 A | 9/1998 | Nakashiba | |
| 5,945,877 A * | 8/1999 | Elango et al. | 330/156 |
| 6,078,204 A | 6/2000 | Cooper et al. | |
| 6,667,607 B2 | 12/2003 | Kawamura et al. | |
| 2004/0195494 A1 | 10/2004 | Kok et al. | |

OTHER PUBLICATIONS

Catalog, Photodiode Characteristics and Applications, UDT Sensors, Inc., 5-14 (2003).
Data Sheet, Surface Mount Silicon PIN Photodiode QSB34, Fairchild Semiconductor Corporation, 3 (Oct. 19, 2004).

* cited by examiner

*Primary Examiner*—Stephone B. Allen
*Assistant Examiner*—Don Williams

(57) ABSTRACT

A circuit has a voltage source, a node, a photodetector electrically coupled between the voltage source and the node, a resistor electrically coupled between the node and ground, and a voltage clamp electrically connected to the node, the voltage clamp configured to maintain a reverse bias of the photodetector above a predetermined level.

19 Claims, 3 Drawing Sheets

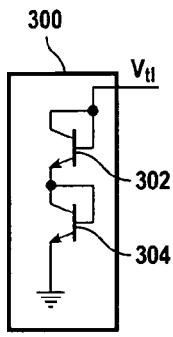
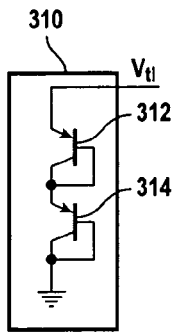
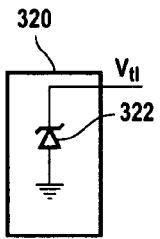
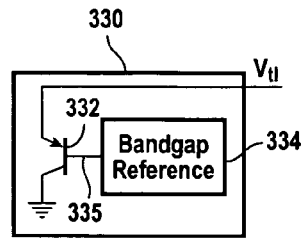
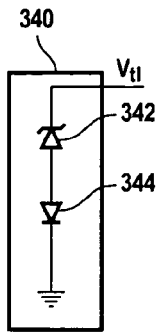
FIG. 3A    FIG. 3B    FIG. 3C    FIG. 3D    FIG. 3E
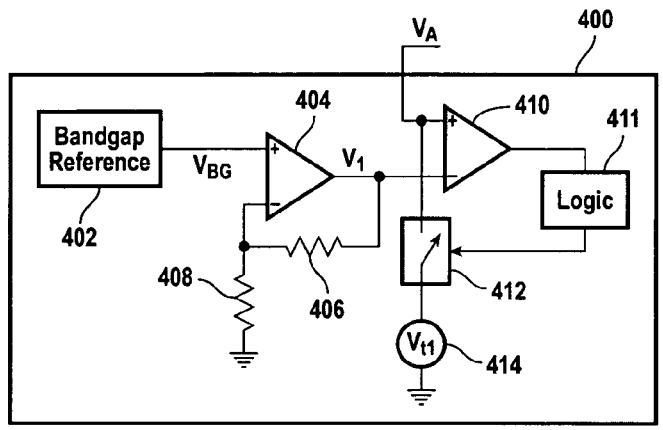
FIG. 4
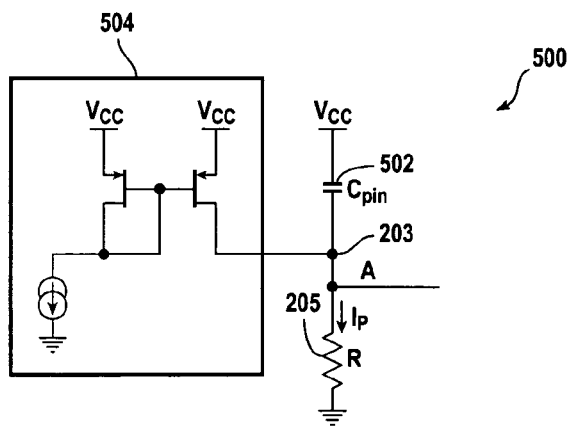
FIG. 5A

PHOTODIODE CIRCUIT WITH IMPROVED RESPONSE TIME

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Light sensing techniques are used in many applications. Some applications, such as turning on a street light after sunset, do not require fast light sensing. In other applications, such as turning on a backlight of a liquid-crystal display ("LCD") of a portable device such as a mobile phone, personal digital assistant ("PDA") or camera, if the ambient is not bright enough to view the LCD, a fast response time is desirable.

For example, photodetectors are used to sense whether a flash needs to be activated while taking a picture with a camera. If the scene is too dim, the photodetector senses a low light condition and sends a signal that activates the camera's flash. However, the flash generates intense light that can saturate the photodetector. Photodetector circuits often have slow recovery, and the photodetector might provide an inaccurate reading if another picture is taken before the photodetector has relaxed. In other words, a first flash can cause the flash to be kept off when camera takes a second picture, even if the lighting of the second picture is dim and light from the flash would be desirable.

Infrared Light Data Sensing (IrDA) applications also use photodetectors. Infrared ("IR") data pulses are transmitted at various frequencies, depending on the IrDA standard being used. For example, data is transferred at 115 Kbps in slow IR ("SIR") mode, at 1 Mbps in medium IR ("MIR") mode, and at 4 Mbps in fast IR ("FIR") mode. Photodiodes with faster response times are desirable for use at the faster data transfer rates.

One type of photodetector that is used in conjunction with a backlight of an LCD is a PIN diode. "PIN" stands for p$^+$-type, intrinsic, n$^+$-type. Switching speed is especially critical for fast data rate applications. It is desirable to minimize the capacitance at the sensing node of photodiode. However due to the nature of the parasitic PIN capacitance that varies with reverse voltage, it is a difficult to control the switching speed, especially in a situation when reverse voltage of the photo device is less than 1V. At such low voltages, the diode capacitance can greatly increase, resulting in a slower fall time and slowing switching speed. A slow fall time limits the data rate received by the PIN diode.

A PIN diode used as a photodiode in light sensing application is usually reversed biased. When reverse bias is applied, a dark current of about 1 nano-Amp to about 3 nano-Amps flows if the photodiode is not illuminated. Illuminating the diode with light of appropriate wavelength(s) increases the reverse current though the diode by generating charge carriers that are swept through the reverse junction. In the illuminated condition, the reverse current increases linearly with increasing reverse voltage (before avalanche breakdown occurs).

FIG. 1A is a circuit diagram of a prior art light sensing circuit 100. When light, represented by an arrow 102, illuminates a PIN diode 104, a photocurrent is generated. The photocurrent flows through a resistor 105 to produce a voltage equivalent $V_A$ at an input to a gain stage 106. The voltage equivalent $V_A$ is amplified by amplifier 106 and passed through a low-pass filter ("LPF") 108. The LPF, 108 averages out the photodiode response, which can have relatively fast-varying components due to light noise and flicker, for example, so that only the relatively time invariant (i.e. essentially DC) component of the voltage equivalent is used. The filtered photodetector output 109 is coupled to a first input 110 of a hysteresis comparator 112. A voltage reference $V_{th}$ ("threshold voltage") is coupled to a second input 113 of the hysteresis comparator 112. The hysteresis comparator 112 basically provides an output signal 114 in a first state (e.g. $V_{CC}$) if the filtered photodetector output 109 is greater than the threshold voltage $V_{th}$, and provides the output signal 114 in a second state (e.g. ground or $-V_{CC}$) if the filtered photodetector output 109 is less than the threshold voltage $V_{th}$, or vice versa. The hysteresis in the hysteresis comparator 112 keeps the backlight from flickering on and off if the filtered photodetector output 109 jitters across the threshold voltage $V_{th}$.

The output 114 of the hysteresis comparator 112 is coupled to an output buffer, also known as a driver or driver stage, 116, and then to an output 118. If the output signal is in the first state, the backlight to the LCD is turned off, and if the output signal is in the second state, the backlight to the LCD is turned on, or vice versa. However, the switching speed of the PIN diode 104 depends on the reverse bias capacitance of the PIN diode, which is a function of the reverse bias voltage.

FIG. 1B is a plot of capacitance versus reverse bias voltage for an exemplary PIN diode. The capacitance, which was measured at a frequency of 1 MHz, is on a linear scale, and the voltage is on a logarithmic scale. The capacitance of the PIN diode equals the permittivity of the PIN junction multiplied by the area of the junction, divided by the distance between the "plates" (conductive regions) of the PIN diode. Thus, as the reverse bias voltage increases, the distance between the conductive regions of the PIN diode increases, reducing the capacitance. Therefore, it is desirable to provide photodetector circuits with improved switching (response) speeds.

BRIEF SUMMARY OF THE INVENTION

A circuit has a voltage source, a node, a photodetector electrically coupled between the voltage source and the node, a resistor electrically coupled between the node and ground, and a voltage clamp electrically connected to the node, the voltage clamp configured to maintain a reverse bias of the photodetector above a predetermined level.

BRIEF DESCRIPTION OF THE DRAWINGS

FIGS. 3A–3E are circuit diagrams of threshold voltage clamps according to embodiments of the invention.

FIG. 4 is a circuit diagram of a threshold voltage clamp that turns on at a first threshold voltage and locks at a second threshold voltage.

FIG. 5A is a circuit diagram used in a simulation of diode switching without clamping.

DETAILED DESCRIPTION OF THE EMBODIMENTS

Figure 1A:
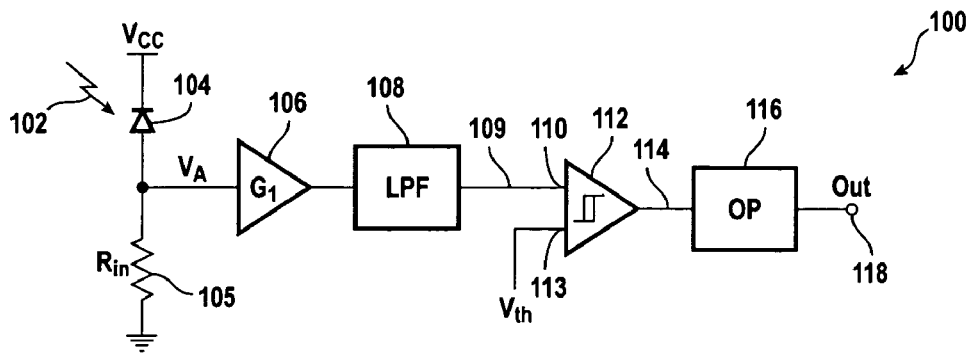
FIG. 1A a circuit diagram of a prior art light sensing circuit 100.

When a PIN diode changes states (i.e. from illuminated to dark, or vice versa), the time it takes for the diode current to change from photocurrent to dark current, or vice versa, increases with decreasing reverse bias voltage. The rise time ($t_R$) and fall time ($t_F$) of a photodiode during switching are generally related according to Equation 1:

$$t_R = \sqrt{t_{DRIFT}^2 + t_{DIFFUSED}^2 + t_{RC}^2} \qquad \text{Eq. 1}$$

Where $t_{DRIFT}$ equals the charge collection time of carriers in the depleted region of the photodiode, $t_{DIFFUSED}$ equals the charge collection time of carriers in the undepleted region of the photodiode, and $t_{RC}$ equals the RC time constant of the diode-circuit combination. The resistance "R" is the sum of the diode series resistance $R_S$ and the load resistance $R_L$ (resistor 105). The capacitance "C" is the sum of the junction capacitance $C_{PIN}$ and stray capacitance $C_S$, in which case $t_{RC}=2.2 \times R \times C$.

Photodiodes can operate in different modes depending on their size, which for convenience of discussion will be referred to as mode 1, mode 2, mode 3, and mode 4. The different modes generally relate to the factors (i.e. $t_{DRIFT}$, $t_{DIFFUSED}$, $t_{RC}$) dominating the rise and fall time. In mode 1, which is called the photovoltaic mode, $V_D$ is essentially zero and, for small diodes (i.e. when the diode area is $\leq 5$ mm$^2$) the rise/fall time will be dominated by $t_{DIFFUSED}$. In mode 1, $t_{DRIFT}$ and $t_{RC}$ do not significantly contribute to the rise/fall time. In mode 2, which is the photovoltaic mode for large diodes (i.e. when the diode area is >5 mm$^2$), $V_D$ is essentially zero, and the rise/fall times will be dominated by be dominated by $t_{RC}$. In mode 2, $t_{DRIFT}$ and $t_{DIFFUSED}$ do not significantly contribute to the rise/fall time.

Mode 3 is called the non-fully depleted photoconductive mode. In this mode, $V_D$ equals a reverse-bias voltage that is not large enough to cause full depletion. All three factors $t_{RC}$, $t_{DRIFT}$ and $t_{DIFFUSED}$ contribute to the rise/fall time. Mode 4 is called the fully depleted photoconductive mode. The reverse bias voltage on the diode is sufficient to cause full depletion. The rise/fall time will be dominated by $t_{DRIFT}$, and $t_{RC}$ and $t_{DIFFUSED}$ do not significantly contribute to the rise/fall time.

It is unlikely that a photodiode having a small area and operating at a low voltage ($V_{CC}$=about 3V to about 5V) would operate in either mode 2 or mode 4. For purposes of discussion, it will be assumed that a photodiode in a conventional IR receiver will be switching between mode 1 and mode 3. The photodiode will be in mode 1 when illuminated, in which case $I_P$ is large, $V_D$ is approximately 0, and the rise/fall time is dominated by $t_{DIFFUSED}$. In the dark (non-illuminated) state, the photodiode will operate in mode 3 and $t_{RC}$, $t_{DRIFT}$ and $t_{DIFFUSED}$ all contribute to the rise/fall time. $I_P$ is small if sufficient reverse voltage is not ensured across the diode. Note that in Mode 1, $C_{PIN}$ is high, which implies $t_{RC}$ is high. However, for $t_{DIFFUSED}$ to dominate, it must be at least 100 times greater than $t_{RC}$. This becomes the main contributor for slow response/switching time of the photodiode. If sufficient reverse voltage is maintained across the photodiode, switching between illuminated states and darks states occurs only in Mode 3. A voltage clamp connected to a terminal of the photodiode can maintain sufficient reverse bias voltage across the photodiode to ensure the diode operates in mode 3 and the switching response times are short.

Figure 2:
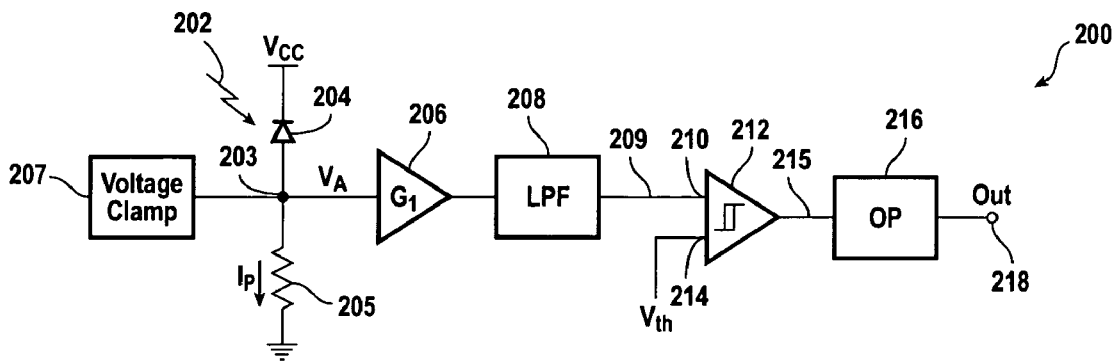
FIG. 2 is a circuit diagram of a photodiode circuit according to an embodiment of the present invention.

FIG. 2 is a circuit diagram of a photodiode circuit 200 according to an embodiment of the present invention. When light, represented by an arrow 202, illuminates a photodector 204, such as a PIN diode, a photocurrent $I_P$ is generated. Phototransistors or other types of photodiodes are used in alternative embodiments. The photocurrent $I_P$ flows through a resistor 205, which converts the current through the resistor into a voltage $V_A$. In this embodiment, ground Gnd provides a voltage reference. The voltage $V_A$ at the summing node 203 is provided to an input of a gain stage 206, similar to $V_A$ in FIG. 1A; however, the voltage clamp 207 maintains the reverse bias applied across the PIN diode 204 above a selected level.

The voltage clamp 207 ensures sufficient reverse voltage for fast response of the PIN diode 204. For example, in an application where $V_{CC}$ is low (about 3.3 V or less) and the PIN diode develops high photocurrent when illuminated (about 3.3 micro-Amps or more), the reverse voltage of the PIN diode might drop to almost zero between the node 203 and $V_{CC}$. Under such conditions (i.e. when the diode is illuminated and no voltage clamp is present), the depletion region of the PIN diode will narrow, resulting in an increase of the junction capacitance, increasing the RC time constant $t_{RC}$ (see Eq. 1). However if the PIN diode enters into mode 1, the switching speed is much slower, as in such a condition $t_{RC}$ is dominanted by $t_{DIFFUSED}$ (which can be at least 100 times greater then $t_{RC}$).

To ensure fast response time of the PIN diode 204, it is desirable to maintain sufficient reverse voltage to ensure a large depletion region, and hence a small capacitance ($C_{PIN}$) so that the diode is operating in a non-fully depleted photoconductive mode. The voltage clamp 207 provides a voltage, $V_{t1}$, that maintains a voltage across the PIN diode 204 between the summing node 203 and $V_{CC}$ to insure that $C_{PIN}$ does not exceed a selected level. The voltage clamp operates such that when $V_A$ is below $V_{t1}$, the voltage at the summing node 203 will not be clamped. In other words, $V_A$ follows the voltage drop across the resistor 205 developed by $I_P$. When $V_A$ exceeds $V_{t1}$, such as when $I_P$ is large due to characteristics of the PIN diode and/or illumination level, the clamp circuit turns on to lock the voltage at the summing node, $V_A$, to $V_{t1}$. This maintains a voltage drop across the PIN diode 204 that is the difference between $V_{t1}$ and $V_{CC}$, even if $I_P$ is high. For example, if $V_{CC}$ equals 3.3 volts, the voltage clamp insures that the minimum reverse bias voltage across the PIN diode 204 is 3.3V–$V_{t1}$. Without the voltage clamp 207, the reverse voltage of the PIN diode could go as low as zero volts, i.e., essentially all the voltage drop from $V_{CC}$ to ground occurs across the resistor 205, and both the anode and cathode of the PIN diode are at essentially $V_{CC}$.

The photodiode circuit 200 differentiates between digital states, namely, it detects a "1" or a "0", depending on the level of the photodetector output in comparison to a reference level ($V_{th}$). Some IR data systems are intended to operate with devices within a range of distances between them (i.e. a variable IR link distance). If the devices are close, the incoming light pulses are stronger than if the devices are far away. Therefore, the photodiode will take longer to recover if communicating devices are placed close to each other, which, without a voltage clamp, can raise $C_{PIN}$ and put the PIN diode into operating mode 1. This can undesirably slow the data rate.

The voltage equivalent $V_A$ is amplified by the amplifier 106 and passed through a low-pass filter ("LPF") 208. The filtered photodetector output 209 is coupled to a first input 210 of a hysteresis comparator 212. A voltage reference $V_{th}$ ("threshold voltage") is coupled to a second input 214 of the hysteresis comparator 212. The hysteresis comparator 212 basically provides an output signal 215 in a first state (e.g. $V_{CC}$) if the filtered photodetector output 209 is greater than the threshold voltage $V_{th}$, and provides an output signal 215 in a second state (e.g. ground or $-V_{CC}$) if the filtered photodetector output 209 is less than the threshold voltage $V_{th}$, or vice versa. Photodiode circuits according to alternative embodiments use other circuit components between the node 203 and the output 218.

The output 215 of the hysteresis comparator 112 is coupled to an output buffer and then to an output 218. If the output signal is in the first state, the backlight to the LCD is turned off, and if the output signal is in the second state, the backlight to the LCD is turned on, or vice versa.

FIGS. 3A–3E are circuit diagrams of voltage clamps according to embodiments of the invention. FIG. 3A shows a voltage clamp 300 according to an embodiment using two npn transistors 302, 304 in cascade configuration. Assuming the npn transistors are substantially similar, the clamp voltage $V_{t1}$ provided by the voltage clamp 300 is essentially equal to twice the base-emitter voltage of the npn transistors Alternative embodiments use different types and/or number of transistors.

FIG. 3B shows a voltage clamp 310 according to an embodiment using pnp transistors 312, 314 in a cascode configuration. Assuming the pnp transistors are substantially similar, the clamp voltage $V_{t1}$ provided by the voltage clamp 300 is essentially equal to twice the base-emitter voltage of the pnp transistors.

The voltage clamps of FIGS. 3A and 3B are relatively simple, but the available clamping voltage is limited to about twice $V_{BE}$. This is suitable for applications where the sensing range of $I_P$ varies from about 0 to about $2V_{BE}/R$ (R being the resistance of the resistor 205). Alternative embodiments use a single npn or pnp device; however, in such cases the that will limit the $I_P$ sensing range from 0 to $V_{BE}/R$. Npn or pnp transistors are desirable because $V_{BE}$ is relatively fixed, unlike the gate-source voltage drop of an MOS transistor, which changes with the sense current $I_P$. However, the clamp voltage in circuits using npn or pnp devices will drop by about 2 mV/° C. as temperature increases. Bipolar devices may also have leakage currents that are undesirable when measuring small Ip values.

FIG. 3C shows a voltage clamp 320 according to an embodiment using a Zener diode to establish $V_{t1}$. The clamp voltage $V_{t1}$ is essentially equal to the Zener voltage, $V_Z$. The voltage clamp of FIG. 3C provides higher voltage clamping, depending on the breakdown voltage of the Zener diode, compared to the embodiments of FIGS. 3A and 3B. The $I_P$ sensing range is from 0 to $V_Z/R$; however, the clamp voltage does not exceed $V_{CC}$.

FIG. 3D shows a voltage clamp 330 according to an embodiment using a pnp transistor 332 and a bandgap reference 334. The bandgap reference 334, which can include a bipolar, CMOS, or inversion bandgap voltage reference, for example, provides a stable voltage, $V_{BG}$, that is relatively insensitive to operating temperature. The bandgap reference 334 biases the base terminal 335 of the pnp transistor 332 so that the clamp voltage $V_{t1}$ is essentially equal to $V_{BG}$ plus $V_{BE}$ of the pnp transistor. In a particular embodiment, a bandgap voltage reference is resistively divided in the bandgap reference 334. An advantage of the voltage clamp 330 is that using a bandgap voltage reference, or a ratio (i.e. resistively divided) bandgap voltage reference, the clamping voltage $V_{t1}$ can be precisely set. With the voltage clamp 330, $V_{t1}$ is set to $(K \times V_{BG})+V_{BE}$, where K is a constant set by the resistive voltage divider, and which can be changed in some embodiments.

FIG. 3E shows a voltage clamp 340 according to an embodiment using a Zener diode 342 in series with a diode 344. The voltage drop across the diode 344 raises the voltage at the anode of the Zener diode 342. The clamp voltage $V_{t1}$ is essentially equal to the diode voltage drop $V_D$ plus the reverse Zener breakdown voltage, $V_Z$. The clamp voltage is $V_Z+V_{BE}$ (compare FIG. 3C). Alternatively, additional diodes, including additional Zener diodes, are added in series between the Zener diode and ground to further raise the voltage at the anode of the Zener diode. The clamp voltage should not exceed the photodetector bias voltage (e.g. $V_{CC}$) for the clamping to be useful.

FIG. 4 is a circuit diagram of a voltage clamp 400 that turns on at a first voltage $V_1$ and locks at a second voltage $V_{t1}$. A bandgap voltage reference 402 provides $V_{BG}$ to an operational amplifier 404. The output voltage $V_1$ of the operational amplifier 404 is set according to ratio of resistors 406, 408 from $V_{BG}$. The output voltage $V_1$ of the operational amplifier 404 is coupled to the negative input of a second operational amplifier 410. Logic 411 between the output of the second operational amplifier 410 and a switch 412 controls operation of the switch. When $V_A$ exceeds $V_1$, the switch 412 closes, coupling $V_{t1}$ from a voltage supply 414 to the summing node (see FIG. 2, ref. num. 203). When $V_A$ drops below $V_1$, such as when the PIN diode (see FIG. 2, ref. num. 204) has sufficient reverse voltage, the switch 414 opens, and the voltage at the summing node is set by the current through the resistor (see FIG. 2, ref. num. 205). An advantage of voltage clamp 400 is that it turns on at $V_1$ but clamps at $V_{t1}$, which provides hysteresis to prevent noise falsely triggering the clamp.

Figure 1B:
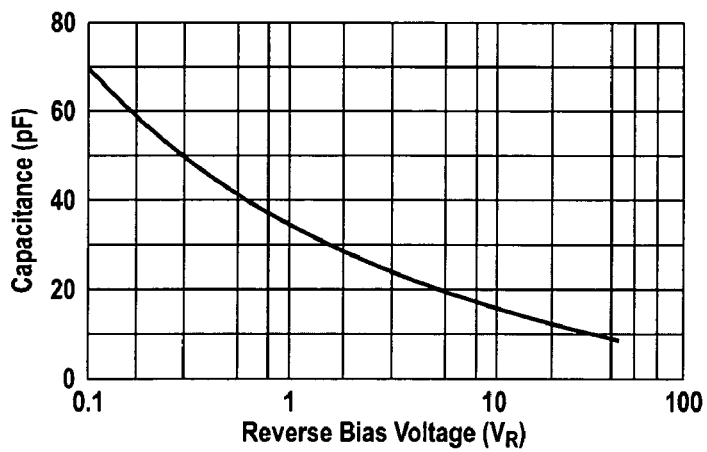
FIG. 1B is a plot of capacitance versus reverse bias voltage for an exemplary PIN diode.

FIG. 5A is a circuit diagram 500 used in a simulation of diode switching without clamping. A PIN diode is modeled as a capacitor 502 having a value of 6 pF at a reverse bias voltage of 1.9 V and 28 pF at a reverse bias voltage of 0.5 V in combination with a PMOS current mirror 504. The resistor 205 was given a value of 1 Mohm. $V_{CC}$ was 3.3 V for all cases. The PMOS current mirror 504 was used in the model to drive a square wave current switching between 0 amps and 3 micro-amps (i.e. 3 micro-amps peak current) into the summing node 203 to emulate a switching light condition for a sensor application. For simplicity, the PIN was modeled as a capacitor at its highest capacitance (occurring when the reverse voltage is at the lowest expected value) and as a capacitor at its lowest capacitance (occurring when the reverse voltage is at the highest expected value). In operation of an actual photodetector circuit, $C_{PIN}$ will be small when $V_R$ is large, and $C_{PIN}$ will increase exponentially as $V_R$ decreases (see FIG. 1B). The resultant voltage versus time characteristic at node 203 is plotted in FIG. 6A.

Figure 5B:
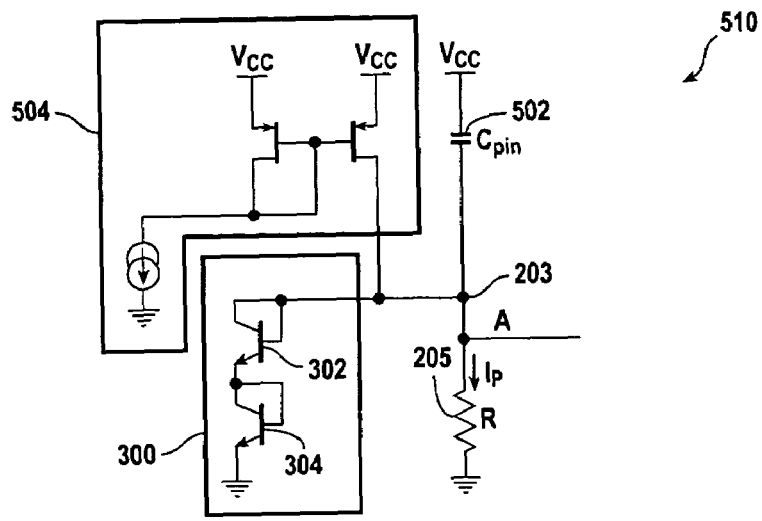
FIG. 5B is a circuit diagram used in a simulation of diode switching with clamping.

FIG. 5B is a circuit diagram 510 used in a simulation of diode switching with clamping. The model included the capacitor 502 representing a PIN diode, the resistor 205, the PMOS current mirror 504, summing node 203, and $V_{CC}$ as in the circuit diagram of FIG. 5A. A voltage clamp 300 (see also, FIG. 3A and associated description) has been added to the circuit diagram. The selection of this voltage clamp is merely exemplary and other voltage clamps are alternatively used. The voltage clamp 300 does not allow the voltage at the summing node 203 to exceed the sum of the base-emitter voltages of the npn transistors 302, 304 in the clamping circuit 300. In a particular embodiment, the npn transistors are substantially identical and the voltage at the summing node 203 is essentially two times $V_{BE}$. This limits the maximum voltage at the summing node to about 1.4 V, rather than about 3.3 V, as in the circuit of FIG. 5A. Thus the capacitance of the PIN diode stays low and response time is improved.

Figure 6A:
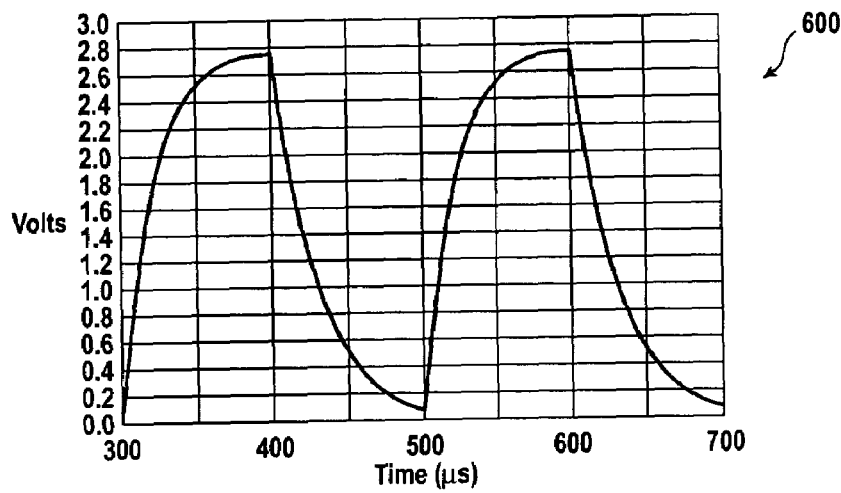
FIG. 6A is a plot of the switching V-I curves for the circuit diagram of FIG. 5A.
Figure 6B:
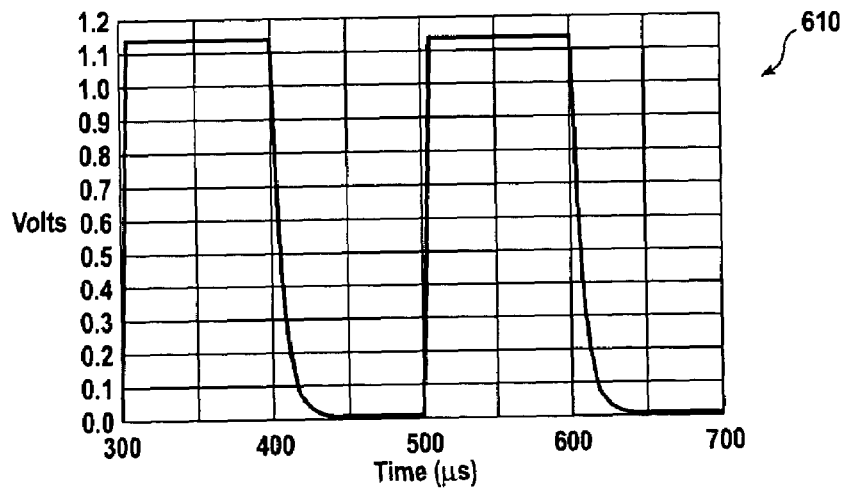
FIG. 6B is a plot of the switching V-I curves for the circuit diagram of FIG. 5B.

The plots in FIGS. 6A and 6B were generated using a circuit simulation program that modeled the circuits shown in FIG. 5A and FIG. 5B, respectively. FIG. 6A shows a plot 600 of the switching voltage versus time at node 203 of FIG. 5A. The plot 600 has a slew rate of 42.9 mV/micro-second between 80% and 20% of the approximately 2.8V maximum voltage.

Note that the vertical axis of FIG. 6B has a different scale than the vertical axis of FIG. 6A. FIG. 6B is a plot of the switching voltage versus time at node 203 of FIG. 5B. FIG. 6B shows a slew rate of 67.5 mV/micro-second between 80% and 20% of the approximately 1.15V maximum voltage.

Comparing the plots of FIGS. 6A and 6B, providing the voltage clamp 300 in the circuit of FIG. 5B reduces the maximum voltage at node 203 from about 2.8 volts to about 1.15 volts. The slew rate is improved from 42.9 mV/micro-second in the circuit of FIG. 5A to 67.5 mV/micro-second in the circuit of FIG. 5B. Other PIN diodes may show more or less improvement in switching speed when a voltage clamp is used, or alternative voltage clamps may show more or less improvement. The modeled circuits of FIGS. 5A and 5B, in particular the values of the components in the circuits, are merely exemplary. For example, a different PIN diode might have a much different capacitance and/or a different $V_R$ versus $C_{PIN}$ characteristic.

An advantage of using voltage clamping in a photodiode circuit is that under low irradiance or low $I_P$ conditions, the voltage developed across R (see FIG. 2, ref. num. 205) will not be enough to activate the voltage clamp. As such, the voltage clamp will not affect the sense current under low irradiance or low $I_P$ conditions. Under high irradiance or high $I_P$ conditions, the voltage clamp maintains sufficient reverse voltage headroom to improve the response time of the photodiode circuit. It is desirable to sense within the range of 0V to the clamp voltage. It is generally desirable that current leakage through a voltage clamp be small in comparison to the photocurrent. While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A circuit comprising:
   a voltage source;
   a node;
   a photodetector electrically coupled between the voltage source and the node;
   a resistor electrically coupled between the node and ground; and
   a voltage clamp electrically connected to the node, the voltage clamp configured to maintain a reverse bias of the photodetector above a predetermined level.

2. The circuit of claim 1 wherein the photodetector is a PIN diode.

3. The circuit of claim 1 wherein the voltage source is Vcc.

4. The circuit of claim 1 wherein the voltage clamp comprises a plurality of bipolar transistors.

5. The circuit of claim 1 wherein the voltage clamp includes at least two bipolar transistors coupled in cascade between the node and ground.

6. The circuit of claim 1 wherein the voltage clamp includes a Zener diode electrically coupled between the node and ground.

7. The circuit of claim 6 further comprising a diode electrically coupled between the Zener diode and ground.

8. The circuit of claim 1 wherein the voltage clamp includes a bandgap voltage reference.

9. The circuit of claim 8 further including a bipolar transistor having a base terminal, wherein the bandgap voltage reference is electrically coupled to the base terminal.

10. The circuit of claim 1 wherein the voltage clamp activates at a first voltage and clamps at a second voltage.

11. A circuit comprising:
    a node;
    a photodetector coupled to the node in a configuration that is operable to provide a reverse-bias voltage across the photodetector; and
    a voltage clamp circuit coupled to the node, the voltage clamp circuit configured to place the node at a clamp voltage that is selected to enable a fast response of the photodetector.

12. The circuit of claim 11, wherein the photodetector is one of a photodiode, a phototransistor, and a PIN diode.

13. The circuit of claim 11, wherein the voltage clamp circuit comprises a transistor that is operable to have a base-emitter voltage $V_{BE}$ whereby the clamp voltage is set at approximately $V_{BE}$ above ground potential.

14. The circuit of claim 11, wherein the voltage clamp circuit comprises a pair of transistors that is operable to have a base-emitter voltage $V_{BE}$ in each of the pair of transistors, and whereby the clamp voltage is set at approximately twice $V_{BE}$ above ground potential.

15. The circuit of claim 11, wherein the voltage clamp circuit comprises a zener diode operable to produce a zener voltage $V_Z$ whereby the clamp voltage is set at approximately $V_Z$ above ground potential.

16. The circuit of claim 11, further comprising:
    a resistor coupled to the node in a configuration that is operable to develop a node voltage at the node, the node voltage being determined by the magnitude of a current flowing through the resistor; and wherein
    the voltage clamp circuit comprises:
        a bandgap voltage reference circuit configured to generate a first voltage reference $V_1$;
        a voltage supply configured to provide a voltage $V_{t1}$;
        a switch operable to selectively couple the voltage $V_{t1}$ to the node; and
        a logic circuit configured to detect the voltage difference between the first voltage reference $V_1$ and the node voltage and accordingly place the switch in one of an open and a closed position.

17. A circuit comprising:
a node;
a photodetector coupled to the node in a configuration that is operable to provide a reverse-bias voltage across the photodetector; and
a voltage clamp circuit coupled to the node, the voltage clamp circuit configured to place the node at a clamp voltage that is selected to maintain the reverse-bias voltage across the photodetector at a level wherein the photodetector is operating in a non-fully depleted photoconductive mode.

18. The circuit of claim 17, wherein the photodetector is a PIN diode and wherein operating in the non-fully depleted photoconductive mode comprises maintaining a capacitance $C_{PIN}$ of the PIN diode below a predetermined level.

19. The circuit of claim 17, wherein the photodetector is a PIN diode and wherein operating in the non-fully depleted photoconductive mode comprises maintaining a depletion region of the PIN diode above a predetermined level.

* * * * *